(12) United States Patent
Tan et al.

(10) Patent No.: US 8,045,308 B2
(45) Date of Patent: Oct. 25, 2011

(54) CLAMP PROTECTION CIRCUIT AND A PFC CONTROL CIRCUIT EMPLOYING SUCH CLAMP PROTECTION CIRCUIT

(75) Inventors: Run Qin Tan, Shenzhen (CN); Li Fang Guo, Shenzhen (CN); Matthew Man Ho Ku, Irvine, CA (US)

(73) Assignee: Evergreen Micro Devices Co., Ltd., Shenzhen (CN)

( * ) Notice: Subject to any disclaimer, the term of this patent is extended or adjusted under 35 U.S.C. 154(b) by 320 days.

(21) Appl. No.: 12/417,288

(22) Filed: Apr. 2, 2009

(65) Prior Publication Data

US 2010/0253410 A1    Oct. 7, 2010

(51) Int. Cl.
  *H02H 3/20* (2006.01)
  *H02H 3/08* (2006.01)
(52) U.S. Cl. ..................... 361/91.1; 361/93.1
(58) Field of Classification Search .......... 361/91.1, 361/93.1
  See application file for complete search history.

(56) References Cited

U.S. PATENT DOCUMENTS

| | | | | |
|---|---|---|---|---|
| 5,949,633 A | * | 9/1999 | Conway | 361/38 |
| 7,027,276 B2 | * | 4/2006 | Chen | 361/56 |
| 7,782,582 B2 | * | 8/2010 | Li | 361/56 |

* cited by examiner

*Primary Examiner* — Jared Fureman
*Assistant Examiner* — Lucy Thomas
(74) *Attorney, Agent, or Firm* — Morris Manning Martin LLP; Tim Tingkang Xia, Esq.

(57) ABSTRACT

The present invention relates to clamp protection circuit and a PFC control circuit employing such clamp protection circuit. Said clamp protection circuit comprises a high voltage isolation module used for receiving power from a high voltage power supply; a voltage clamp module used for receiving an output low voltage from the high voltage isolation module and realizing a clamp protection; and a low voltage bias module used for providing bias voltage to the high voltage isolation module and the voltage clamp module. By employing the clamp protection circuit, the precision of the clamp voltage is improved, the design is simplified and the silicon area is reduced. Meanwhile, the transient response is enhanced. Moreover, when the clamp protection circuit is applied in a PFC control circuit, the design of the whole PFC control circuit is simplified and the silicon area is reduced, and the precision and transient response of the clamp voltage of the clamp protection circuit inside the PFC control circuit are improved.

16 Claims, 6 Drawing Sheets

CLAMP PROTECTION CIRCUIT AND A PFC CONTROL CIRCUIT EMPLOYING SUCH CLAMP PROTECTION CIRCUIT

FIELD OF THE INVENTION

The present invention relates to a switch power supply circuit, and more specific, to a lower voltage limit clamp protection circuit and a PFC control circuit employing such clamp protection circuit.

BACKGROUND OF THE INVENTION

A clamp protection circuit, that is, a circuit used to protect a part of the circuit from exceeding a clamp value, so as to maintain the circuit operating safely and moreover, the device and function of the circuit won't be damaged. Such voltage clamp protection circuit is widely applied in an integrated circuit design, especially in a power supply controller IC, such as AC-DC converter, power factor correction controller and so on.

Zero-crossing detection module is widely used in Transition Mode Power Factor Correction (PFC) controller chip for detection of zero current crossing event in boost inductor. When the zero current crossing event is detected, a new switch cycle is triggered by turning on power switch. Thus, the system operates at the boundary between continuous and discontinuous current mode or so called Transition Mode. Switching loss and noise can be minimized while the system operates in Transition Mode. Zero-crossing detection function is normally realized by inspecting the voltage change of the secondary side of the transformer depicted in FIG. 1. The operation principle of zero-crossing detection is described as follows: When the power switch device Q is conducted, the inductor Lb is charged by the rectified AC voltage Vg(t), the diode D at the output terminal is reverse biased, and the load current is obtained from the output capacitor Co, the current of the inductor Lb is linearly increased, and the voltage of Vz is −Vg(t)/n where n is the turn ratio of the transformer. As the RMS value of the AC input voltage is in the range of 85 V to 265 V, the voltage variation of Vz is confined from minus a ten of to a few tens of volts. If such Vz is directly added to the ZCD pin of the PFC controller chip, high voltage stress sustainable device is required, which in turn increases the die size and complicates the circuit design. In order to release the high voltage stress constrain, a clamp protection circuit is introduced.

A prior art voltage clamp design is illustrated at the circuit 100 in FIG. 1. When the voltage of Vz is negative, the isolation high voltage device 106 is conducted, and the gate voltage of device 104 is pulled down, and branch current I1 is generated. The branch current I1 is mirror amplified by a high voltage device 105 to form a branch current I2. The branch current I1 and I2 are combined to have a lower limit clamp current I which goes through the resistor R1 to clamp the voltage of ZCD pin to the voltage of NodeA−Vgs(106), so as not to damage the devices in the chip. However, there is a substantial voltage change for Vz from application to application, and the lower limit clamp current I can vary from few tens μA all the way up to several mA. Therefore, an external high voltage power source Vcc is required for the voltage clamp circuit working properly. FIG. 1 illustrates a prior art circuit design for voltage clamp. In order to work with high voltage power source Vcc, high voltage device 101, 104, 105 and 106 are used that occupies large silicon area and results in high cost. In addition, as the device 101, 104, 105 are voltage-controlled, the accuracy of the clamp voltage of the clamp protection circuit is very limited while the variation of bias current, process and temperature are taken into account. Meanwhile, device 105 is vulnerable to ESD damage as it forms an electrostatic discharge path between the ZCD pin and power supply Vcc. The damage of device 105 will cause the voltage clamp circuit malfunction.

Accordingly, a clamp protection circuit with improved precision of the clamp voltage, simplified design and silicon area saving is proposed.

SUMMARY OF THE INVENTION

The primary objective of this invention is to overcome said problem of the prior art and provide a clamp protection circuit with improved precision of the clamp voltage, simple and silicon saving design.

The technical solution employed by the present invention to solve such problems is constructing a clamp protection circuit, which comprising:

a high voltage isolation module used for receiving power from a high voltage power supply;

a voltage clamp module used for receiving an output low voltage from the high voltage isolation module and realizing a clamp protection; and a low voltage bias module used for providing bias voltage to the high voltage isolation module and the voltage clamp module.

Advantagely, said clamp protection circuit comprises only one high voltage device.

Advantagely, said low voltage bias module comprises a first bias module used for providing bias voltage to the high voltage isolation module and a second bias module used for providing bias voltage to the voltage clamp module.

Advantagely, the high voltage isolation module comprises a high voltage isolation transistor, a first diode, wherein the gate of the high voltage isolation transistor is connected to a first bias output terminal of the first bias module, the source and bulk are connected to the input terminal of the voltage clamp module, and the drain is connected to the high voltage power supply; the anode of the first diode is grounded and the cathode is connected to the input terminal of the voltage clamp module.

Advantagely, the voltage clamp module comprises a first switch device, the base of the first switch device is connected to the second bias output terminal of the second bias module, the collector is the input terminal of the voltage clamp module and connected to the source and bulk of the high voltage isolation transistor, and the emitter is connected to the clamp point.

Advantagely, the second bias module comprises a bias current source, at least one switch device, a transistor; wherein, the output terminal of the bias current source is the second bias output terminal; the emitter of the at least one switch device is grounded, the collector and base are connected to the output terminal of the bias current source; the gate of the transistor is connected to the input terminal of the voltage clamp module, the drain is connected to the second bias output terminal, the source and bulk is connected to the first bias output terminal of the first bias module.

Advantagely, the second bias module comprises a bias current source, a first switch device, a second switch device and a transistor; wherein, the output terminal of the bias current source is the second bias output terminal; the emitter of the second switch device is connected to the collector and base of the first switch device, the collector and base of the second switch device are connected to the output terminal of the bias current source, the emitter of the first switch device is grounded; the gate of the transistor is connected to the input terminal of the voltage clamp module, the drain is connected to the second bias output terminal, the source and bulk is connected to the first bias output terminal of the first bias module.

Advantagely, the second bias module further comprises multiple of switch devices.

Advantagely, the first bias module comprises a first resistor and a second diode; wherein the anode of the second diode is grounded, and the cathode of the second diode is the first bias output terminal, the first resistor is connected between the high voltage power supply and the first bias output terminal.

Advantagely, said switch device is low voltage NPN transistor.

Advantagely, said diodes are zener diodes

The second objective of this invention is to provide a PFC control circuit, which comprising:

a boost module;

a zero-crossing detection module used for detecting whether a current of a boost inductor in the boost module have crossed a zero point;

a PFC control chip, and a clamp protection circuit connected to the ZCD pin of the PFC control chip; wherein, said clamp protection circuit comprising:

a high voltage isolation module used for receiving power from a high voltage power supply;

a voltage clamp module used for receiving an output low voltage from the high voltage isolation module and realizing a clamp protection; and a low voltage bias module used for providing bias voltage to the high voltage isolation module and the voltage clamp module.

Advantagely, said clamp protection circuit comprises only one high voltage device.

Advantagely, said low voltage bias module comprises a first bias module used for providing bias voltage to the high voltage isolation module and a second bias module used for providing bias voltage to the voltage clamp module.

Advantagely, the high voltage isolation module comprises a high voltage isolation transistor, a first diode, wherein the gate of the high voltage isolation transistor is connected to a first bias output terminal of the first bias module, the source and bulk are connected to the input terminal of the voltage clamp module, and the drain is connected to the high voltage power supply; the anode of the first diode is grounded and the cathode is connected to the input terminal of the voltage clamp module.

Advantagely, the voltage clamp module comprises a first switch device, the base of the first switch device is connected to a second bias output terminal of the second bias module, the collector is the input terminal of the voltage clamp module and connected to the source and bulk of the high voltage isolation transistor, and the emitter is connected to the clamp point.

Advantagely, the second bias module comprises a bias current source, at least one switch device, a transistor; wherein, the output terminal of the bias current source is the second bias output terminal; the emitter of the at least one switch device is grounded, the collector and base are connected to the output terminal of the bias current source; the gate of the transistor is connected to the input terminal of the voltage clamp module, the drain is connected to the second bias output terminal, the source and bulk is connected to the first bias output terminal of the first bias module.

Advantagely, the second bias module comprises a bias current source, a first switch device, a second switch device, and a transistor; wherein, the output terminal of the bias current source is the second bias output terminal; the emitter of the second switch device is connected to the collector and base of the first switch device, the collector and base of the second switch device are connected to the output terminal of the bias current source, the emitter of the first switch device is grounded; the gate of the transistor is connected to the input terminal of the voltage clamp module, the drain is connected to the second bias output terminal, the source and bulk is connected to the first bias output terminal of the first bias module.

Advantagely, the second bias module further comprises multiple of switch devices.

Advantagely, the first bias module comprises a first resistor and a second diode; wherein the anode of the second diode is grounded, and the cathode of the second diode is the first bias output terminal, the first resistor is connected between the high voltage power supply and the first bias output terminal.

Advantagely, said switch device is low voltage NPN transistor.

Advantagely, said diodes are zener diodes

By employing the clamp protection circuit, the precision of the clamp voltage is improved, the design is simplified and the silicon area is reduced. Meanwhile, the transient response is enhanced. Moreover, when the clamp protection circuit is applied in a PFC control circuit, the design of the whole PFC control circuit is simplified and the silicon area is reduced, and the precision and transient response of the clamp voltage of the clamp protection circuit inside the PFC control circuit are improved.

BRIEF DESCRIPTION OF THE DRAWINGS

So as to further explain the invention, an exemplary embodiment of the present invention will be described with reference to the below drawings, wherein.

DETAILED DESCRIPTION OF THE PREFERRED EMBODIMENT

These and other advantage, aspect and novel features of the present invention, as well as details of an illustrated embodiment thereof, will be more fully understand from the following description and drawings. While various embodiments of the present invention has been presented by way of example only, and not limitation.

Figure 2:
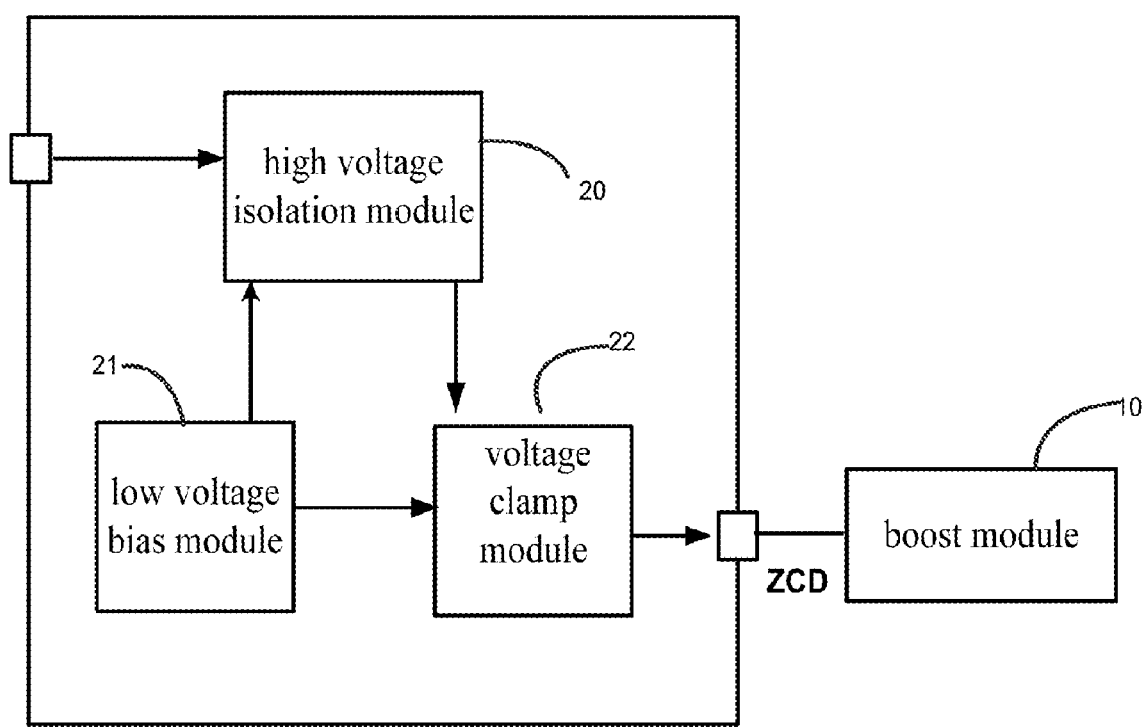
FIG. 2 is a block diagram of a clamp protection circuit according to the first example of the present invention.

FIG. 2 is a block diagram of a clamp protection circuit according to the first example of the present invention. Referring to FIG. 2, the clamp protection circuit comprises: a high voltage isolation module 20 used for receiving power from a high voltage power supply Vcc, a voltage clamp module 22 used for receiving an output low voltage from the high voltage isolation module 20 and realizing a clamp protection; and a low voltage bias module 21 used for providing bias voltage to the high voltage isolation module 20 and the voltage clamp module 22.

Figure 3:
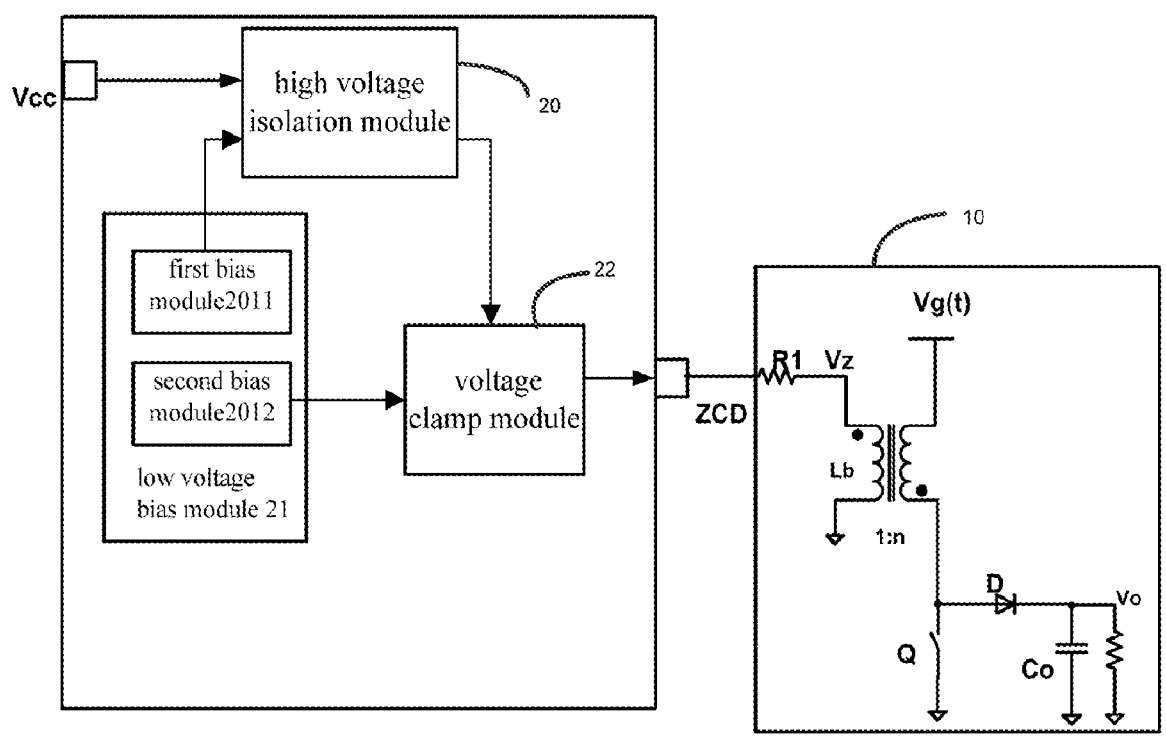
FIG. 3 is a block diagram of a clamp protection circuit according to the second example of the present invention.

FIG. 3 is a block diagram of a clamp protection circuit according to the second example of the present invention. Referring to FIG. 3, said low voltage bias module 21 comprises a first bias module 2011 used for providing bias voltage to the high voltage isolation module 20 and a second bias module 2012 used for providing bias voltage to the voltage clamp module 22.

Figure 4:
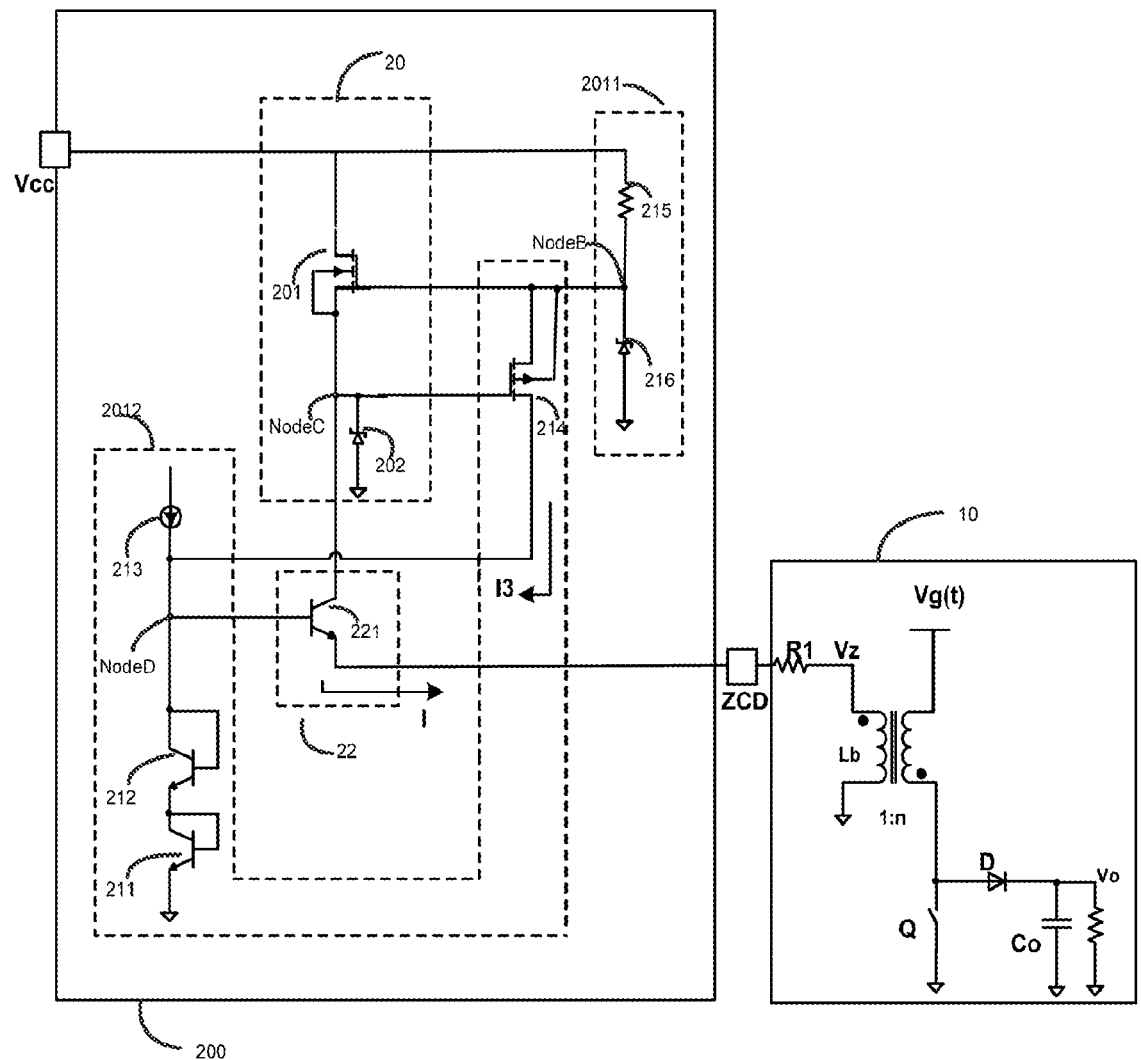
FIG. 4 is a circuit block diagram of a clamp protection circuit according to the third example of the present invention.

FIG. 4 is a circuit block diagram of a clamp protection circuit according to the third example of the present invention. Referring to FIG. 4, the high voltage isolation module 20 comprises a high voltage isolation transistor 201, zener diode 202, wherein the gate of the high voltage isolation transistor 201 is connected to Node B, the source and bulk are connected to Node C, and the drain is connected to the high voltage power supply Vcc. The anode of the zener diode 202 is grounded and the cathode of the zener diode 202 is connected to Node C.

The voltage clamp module 22 comprises switch device 221, the base of the switch device 221 is connected to Node D, the collector is connected to the source and bulk of the high voltage isolation transistor 201, and the emitter is connected to the clamp point ZCD.

Said low voltage bias module 21 may comprise a first bias module 2011 and a second bias module 2012. The second bias module 2012 comprises bias current source 213, switch device 212, 211 and transistor 214. Wherein, the output terminal of the bias current source is Node D. The base and collector of the switch device 212 are short connected and both of which are connected to Node D, and the emitter of the switch device 212 is connected to the base and collector of the switch device 211, and the emitter of the switch device 211 is grounded. In the other embodiment of the present invention, more switch devices may be employed, and the clamp voltage can be adjusted by increasing or reducing the amount of the switch devices. The gate of the transistor 214 is connected to Node C, the drain is connected to Node D, the source and bulk are connected to Node B.

The first bias module 2011 comprises resistor 215 and diode 216. The anode of the diode 216 is grounded, and the cathode of the diode 216 is Node B. The resistor 215 is connected between high voltage Vcc and Node B.

Figure 1:
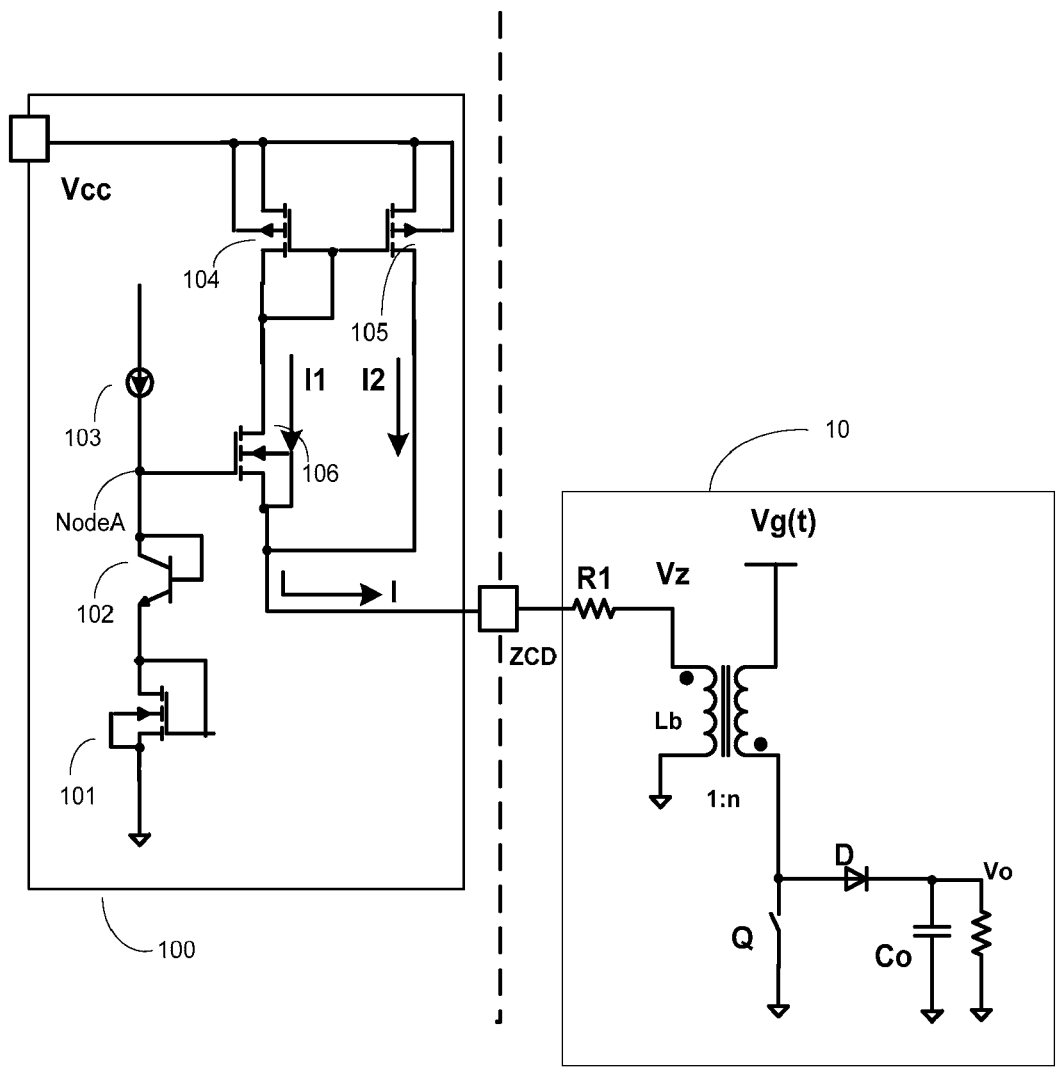
FIG. 1 is a functional block diagram of a clamp protection circuit according with the prior art.

In the embodiment in FIG. 2-4, a boost module 10 is connected to the clamp point ZCD (that is, the ZCD pin of a PFC chip). The boost module 10 according to the present invention can employ any known design in prior art (referring to FIG. 1). In the embodiment of functional block 200 in FIG. 4, the switch device 221 could be but not limited to a low voltage NPN transistor, and said diodes are zener diodes. The transistor 214 is a low voltage PMOS device.

Figure 5:
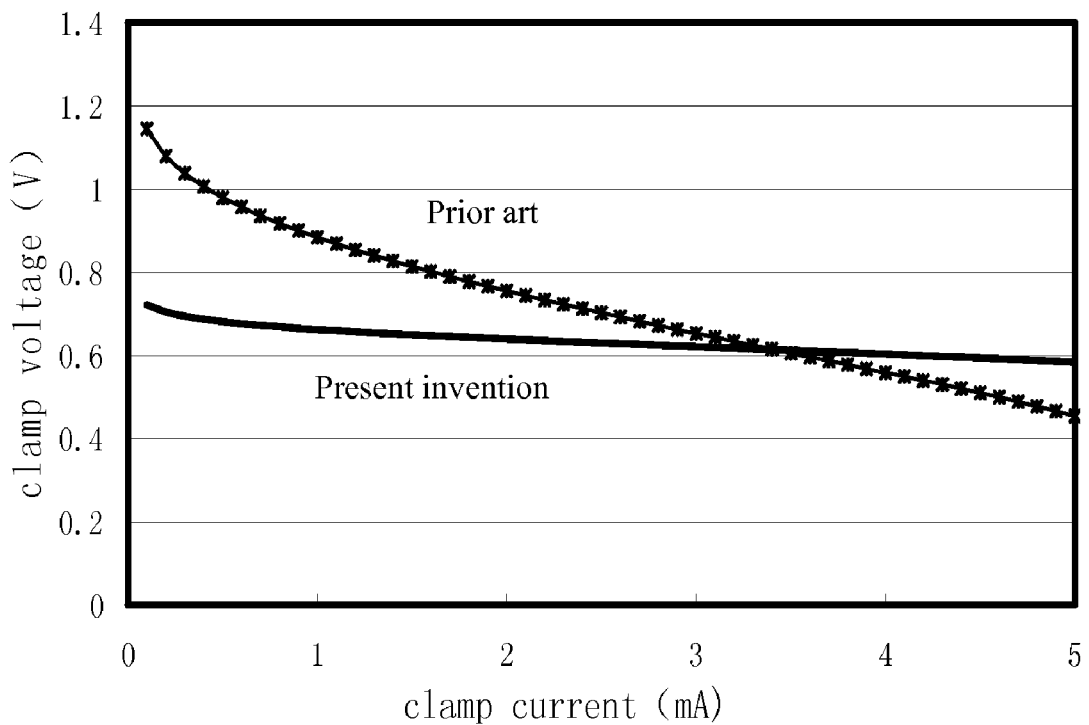
FIG. 5 is a clamp current against clamp voltage characteristic of the clamp protection circuit according to the prior art and the present invention, wherein the clamp voltage changes with the clamp current.
Figure 6:
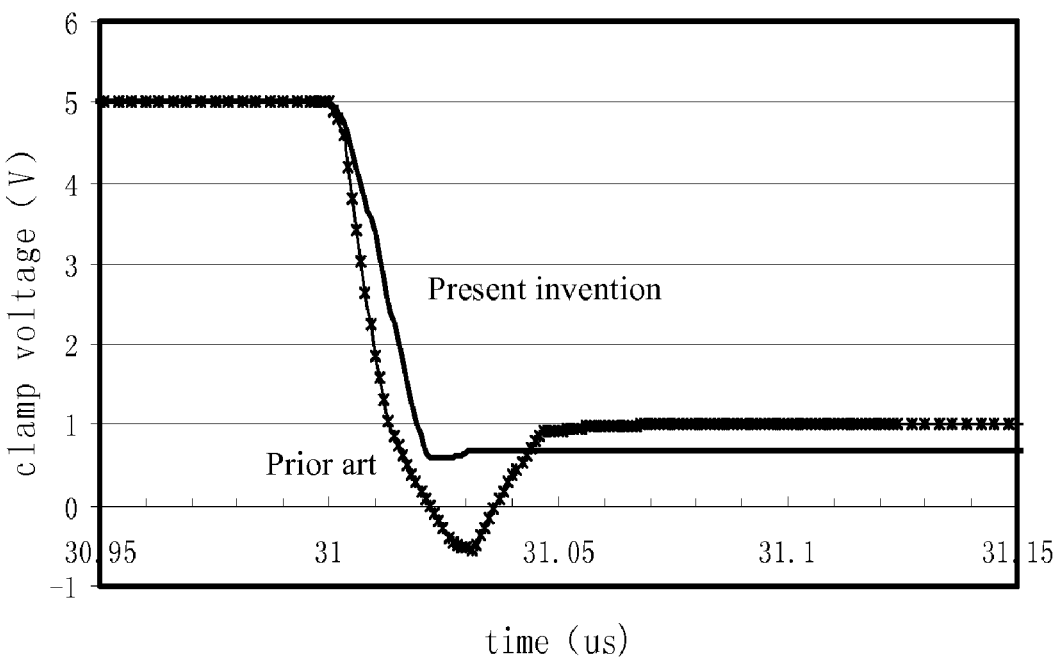
FIG. 6 is a waveform of the transient response of the clamp protection circuit according to the prior art and the present invention.

The embodiment shown in FIG. 4 is explained with the aid of FIG. 5 and 6. FIG. 5 shows a clamp current against clamp voltage characteristic of the prior art and the present invention for the purpose of comparison. Under typical condition, the current of the voltage clamp may vary from 100 uA to 5 mA that results in close to 0.7V clamp voltage variation. Process variation and temperature change may incur even higher variation of clamp voltage. The present invention resolves the issue of high variation of clamp voltage mentioned in the prior art design by introducing high voltage isolation circuit that makes it possible to implement the switch device with a low voltage NPN transistor device instead of using the high voltage NMOS device. The use of NPN transistor leads to the improvement of clamp voltage transient response and clamp voltage accuracy. The operating principle is explained in detail as follows:

Vcc is a high voltage power supply which may be higher than 20 V. Over 20V NPN device is not technology compatible with generic low cost high voltage CMOS process. In the specific circuit of FIG. 4, a high voltage isolation module 20 consisted of a high voltage isolation transistor 201 which is available in generic low cost high voltage CMOS process and a zener diode 202 is used to isolate the high voltage Vcc from low voltage circuitry such that an under 13V NPN device, which is available in low cost high voltage CMOS process, can be used.

Said low voltage bias module 21 comprises NPN transistor 211, 212, bias current source 213, low voltage PMOS device 214. Among these, NPN transistor 211, 212 and bias current source 213 are used to provide steady state bias for voltage clamp module 22, and when the voltage at pin ZCD is lower than the clamp voltage, the emitter of the transistor 221 in voltage clamp module 22 is forward biased, and the collector of the transistor 221 is reverse biased, and the clamp current I flows from the ZCD pin, through the resistor R1 in the boost module 10, so as to clamp the voltage at pin ZCD to NodeD−Vbe. The level of the clamp voltage can be adjusted by increasing or decreasing the number of multiple of the NPN transistor 211, 212. When the clamp current I increases to a certain level, the current gain of the NPN transistor 211 will reduce, and more base current should be drained from Node D to satisfy the clamp current I. However, the bias current generated from current source 213 is relatively constant, so the voltage at Node D can't be maintained, and so low voltage PMOS devices 214 is employed in low voltage bias module 21 to provide a dynamic bias current I3 for Node D. When the clamp current I increases, the voltage at Node C drops, the voltage across source to gate of low voltage PMOS devices 214 increases,_and which in turns provides larger current I3 to Node D, and more base current to NPN transistor 211, and so clamp voltage are maintained.

Referring to FIG. 5, the accuracy of clamp voltage of present invention is drastically improved and the clamp voltage variation is well controlled within plus and minus 0.15V. By inspecting the circuit 200 in FIG. 4, isolation transistor 201 (in the present invention, it may be high voltage isolation NMOS device) in high voltage isolation module 20 is the only device have to sustain high voltage stress, the rest of them are low voltage devices that in turns saves over 30% silicon area comparing with prior art design. The present circuit invention makes it more robust to ESD event as the ESD damage susceptible path has been eliminated. FIG. 6 shows the transient response of the clamp protection circuit when the voltage of Vz suddenly changes from higher than the clamp voltage to lower than the clamp voltage. By comparing both transient response waveforms, the present invention shows faster transient response and smaller undershoot voltage. Under the same testing condition, the prior art clamp protection circuit allows over 1V overshooting voltage. Although the high voltage device 105 in the prior art clamp protection circuit 100 have a mirror amplification factor to reduce the overshoot voltage, but that further increases the required silicon area.

The present clamp protection circuit invention demonstrates supreme electrical performance in terms of clamp voltage setting flexibility, clamp voltage accuracy and transient response. Its one device high voltage isolation approach and generic high voltage CMOS process compatible design makes it idea for cost sensitive PFC controller chip.

Figure 7:
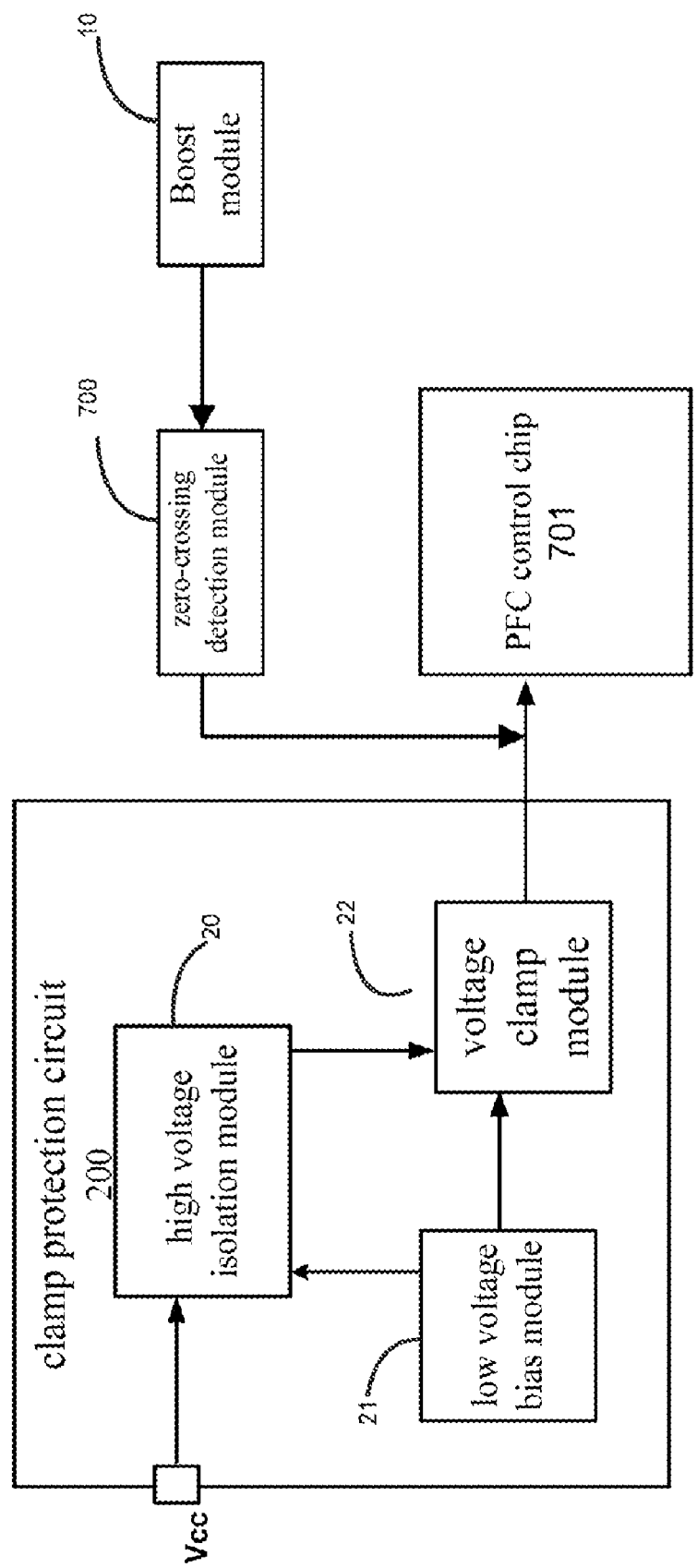
FIG. 7 is a block diagram of a PFC control circuit according to the present invention.

FIG. 7 is a block diagram of a PFC control circuit according to the present invention. As shown in FIG. 7, such PFC control circuit comprises: a boost module 10; a zero-crossing detection module 700 used for detecting whether a current of a boost inductor in the boost module 100 have crossed a zero point; a PFC control chip 701, and a clamp protection circuit 200 connected to the ZCD pin of the PFC control chip 701. Said clamp protection circuit 200 comprises a high voltage isolation module 20 used for receiving power from a high voltage power supply; a voltage clamp module 22 used for receiving an output low voltage from the high voltage isolation module 20 and realizing a clamp protection; and a low voltage bias module 21 used for providing bias voltage to the high voltage isolation module 20 and the voltage clamp module 22.

Each module in the PFC control circuit may be constructed according to FIG. 1-4. One skilled in this art may complete the construction of said modules based on the prior art and the teaching of the present invention.

The foregoing description is just the preferred embodiment of the invention. It is not intended to exhaustive or to limit the invention. Any modifications, variations, and amelioration without departing from the spirit and scope of the present invention should be included in the scope of the prevent invention.

And moreover, the present invention also may be integrated into an AC-to-DC converter, or a power supply and other situation allowable.

The invention claimed is:

1. A clamp protection circuit, wherein, it comprises:
a high voltage isolation module used for receiving power from a high voltage power supply;
a voltage clamp module used for receiving an output low voltage from the high voltage isolation module and realizing a clamp protection; and
a low voltage bias module used for providing bias voltage to the high voltage isolation module and the voltage clamp module, wherein,
said low voltage bias module comprises a first bias module used for providing bias voltage to the high voltage isolation module and a second bias module used for providing bias voltage to the voltage clamp module, wherein
a transistor in the second bias module detects a clamp current and produces a current fed back to the voltage clamp module based on changes of the clamp current, so that dynamic compensation is provided for the change of the clamp current, and high clamp voltage accuracy is guaranteed.

2. The clamp protection circuit according to claim 1, wherein, said clamp protection circuit comprises only one high voltage device.

3. The clamp protection circuit according to claim 1, wherein, the high voltage isolation module comprises a high voltage isolation transistor, a first diode, wherein the gate of the high voltage isolation transistor is connected to a first bias output terminal of the first bias module, the source and bulk are connected to the input terminal of the voltage clamp module, and the drain is connected to the high voltage power supply; the anode of the first diode is grounded and the cathode is connected to the input terminal of the voltage clamp module.

4. The clamp protection circuit according to claim 3, wherein, the voltage clamp module comprises a first switch device, the base of the first switch device is connected to a second bias output terminal of the second bias module, the collector is the input terminal of the voltage clamp module and connected to the source and bulk of the high voltage isolation transistor, and the emitter is connected to the clamp point.

5. The clamp protection circuit according to claim 4, wherein, besides the transistor, the second bias module comprises a bias current source, at least one switch device; wherein, the output terminal of the bias current source is the second bias output terminal; the emitter of the at least one switch device is grounded, the collector and base are connected to the output terminal of the bias current source; the gate of the transistor is connected to the input terminal of the voltage clamp module, the drain is connected to the second bias output terminal, the source and bulk is connected to the first bias output terminal of the first bias module.

6. The clamp protection circuit according to claim 4, wherein, the second bias module comprises a bias current source, a first switch device, a second switch device, and the transistor; wherein, the output terminal of the bias current source is the second bias output terminal; the emitter of the second switch device is connected to the collector and base of the first switch device, the collector and base of the second switch device are connected to the output terminal of the bias current source, the emitter of the first switch device is grounded; the gate of the transistor is connected to the input terminal of the voltage clamp module, the drain is connected to the second bias output terminal, the source and bulk is connected to the first bias output terminal of the first bias module.

7. The clamp protection circuit according to claim 4, wherein, the first bias module comprises a first resistor and a second diode; wherein the anode of the second diode is grounded, and the cathode of the second diode is the first bias output terminal, the first resistor is connected between the high voltage power supply and the first bias output terminal.

8. The clamp protection circuit according to claim 7, said switch device is low voltage NPN transistor and said diodes are zener diodes.

9. A PFC control circuit, which comprises:
a boost module;
a zero-crossing detection module used for detecting whether a current of a boost inductor in the boost module have crossed a zero point;
a PFC control chip, and
a clamp protection circuit connected to the ZCD pin of the PFC control chip;
wherein, said clamp protection circuit comprises:
a high voltage isolation module used for receiving power from a high voltage power supply;
a voltage clamp module used for receiving an output low voltage from the high voltage isolation module and realizing a clamp protection; and
a low voltage bias module used for providing bias voltage to the high voltage isolation module and the voltage clamp module, wherein,
said low voltage bias module comprises a first bias module used for providing bias voltage to the high voltage isolation module and a second bias module used for providing bias voltage to the voltage clamp module, wherein
a transistor in the second bias module detects a clamp current and produces a current fed back to the voltage clamp module based on changes of the clamp current, so that dynamic compensation is provided for the change of the clamp current, and high clamp voltage accuracy is guaranteed.

10. The PFC control circuit according to claim 9, wherein, said clamp protection circuit comprises only one high voltage device.

11. The PFC control circuit according to claim 9, wherein, the high voltage isolation module comprises a high voltage isolation transistor, a first diode, wherein the gate of the high voltage isolation transistor is connected to a first bias output terminal of the first bias module, the source and bulk are connected to the input terminal of the voltage clamp module, and the drain is connected to the high voltage power supply; the anode of the first diode is grounded and the cathode is connected to the input terminal of the voltage clamp module.

12. The PFC control circuit according to claim 11, wherein, the voltage clamp module comprises a first switch device, the base of the first switch device is connected to a second bias output terminal of the second bias module, the collector is the input terminal of the voltage clamp module and connected to the source and bulk of the high voltage isolation transistor, and the emitter is connected to the clamp point.

13. The PFC control circuit according to claim 12, wherein, besides the transistor, the second bias module comprises a bias current source, at least one switch device; wherein, the output terminal of the bias current source is the second bias output terminal; the emitter of the at least one switch device is grounded, the collector and base are connected to the output terminal of the bias current source; the gate of the transistor is connected to the input terminal of the voltage clamp module, the drain is connected to the second bias output terminal, the source and bulk is connected to the first bias output terminal of the first bias module.

14. The PFC control circuit according to claim 12, wherein, the second bias module comprises a bias current source, a first switch device, a second switch device and the transistor; wherein, the output terminal of the bias current source is the second bias output terminal; the emitter of the second switch device is connected to the collector and base of the first switch device, the collector and base of the second switch device are connected to the output terminal of the bias current source, the emitter of the first switch device is grounded; the gate of the transistor is connected to the input terminal of the voltage clamp module, the drain is connected to the second bias output terminal, the source and bulk is connected to the first bias output terminal of the first bias module.

15. The PFC control circuit according to claim 12, wherein, the first bias module comprises a first resistor and a second diode; wherein the anode of the second diode is grounded, and the cathode of the second diode is the first bias output terminal, the first resistor is connected between the high voltage power supply and the first bias output terminal.

16. The PFC control circuit according to claim 15, said switch device is low voltage NPN transistor and said diodes are zener diodes.

* * * * *